(12) United States Patent
Riedel

(10) Patent No.: US 9,785,003 B2
(45) Date of Patent: Oct. 10, 2017

(54) ELECTRONIC DEVICE

(71) Applicant: Airbus Operations GmbH, Hamburg (DE)

(72) Inventor: Christian Riedel, Bliedersdorf (DE)

(73) Assignee: Airbus Operations GmbH, Hamburg (DE)

( * ) Notice: Subject to any disclaimer, the term of this patent is extended or adjusted under 35 U.S.C. 154(b) by 344 days.

(21) Appl. No.: 14/089,302

(22) Filed: Nov. 25, 2013

(65) Prior Publication Data

US 2014/0152913 A1    Jun. 5, 2014

Related U.S. Application Data

(60) Provisional application No. 61/731,890, filed on Nov. 30, 2012.

(30) Foreign Application Priority Data

Nov. 30, 2012 (EP) .................................. 12195119

(51) Int. Cl.

| G02F 1/1333 | (2006.01) |
|---|---|
| H05K 5/00 | (2006.01) |
| H05K 9/00 | (2006.01) |
| H05K 1/02 | (2006.01) |
| B64D 11/00 | (2006.01) |

(52) U.S. Cl.
CPC .... *G02F 1/13338* (2013.01); *G02F 1/133308* (2013.01); *G02F 1/133385* (2013.01);
(Continued)

(58) Field of Classification Search
CPC ............ G02F 1/13308; G02F 1/13338; G02F 1/133385; G02F 1/133608;
(Continued)

(56) References Cited

U.S. PATENT DOCUMENTS

| 6,058,288 A | 5/2000 | Reed |
|---|---|---|
| 6,177,887 B1 | 1/2001 | Jerome |

(Continued)

FOREIGN PATENT DOCUMENTS

JP    H10-173348    6/1998

OTHER PUBLICATIONS

Extended European Search Report for Application No. 12195119.8 dated Apr. 29, 2013.

*Primary Examiner* — Nathanael R Briggs
*Assistant Examiner* — William Peterson
(74) *Attorney, Agent, or Firm* — Jenkins, Wilson, Taylor & Hunt, P.A.

(57) ABSTRACT

The present invention relates to an electronic device including a display module and an electronics module arranged in a common housing, wherein the common housing is completed by a front cover, wherein the display module is arranged directly adjacent to the front cover, wherein the electronics module includes a printed circuit board having multiple layers and a plurality of electronic components attached to the printed circuit board, wherein the electronics module is arranged adjacent to the display module and wherein the printed circuit board includes a first layer and a second layer delimiting the printed circuit board on opposing sides, wherein the first layer is an electromagnetic interference shielding layer and the first layer is arranged facing the display module.

11 Claims, 3 Drawing Sheets

(52) U.S. Cl.
CPC ......... *H05K 5/0017* (2013.01); *H05K 9/0037* (2013.01); *B64D 11/0015* (2013.01); *H05K 1/0218* (2013.01); *H05K 2201/0715* (2013.01)

(58) Field of Classification Search
CPC ........ G02F 2001/133314; G02F 2001/133628; G02F 2001/133317; G02F 2001/133331; H05K 1/0218; H05K 5/0017; H05K 2201/0715; H05K 9/0037; B64D 11/0015
USPC .......................................................... 349/58
See application file for complete search history.

(56) References Cited

U.S. PATENT DOCUMENTS

| | | | |
|---|---|---|---|
| 6,297,551 B1* | 10/2001 | Dudderar | H01L 23/055 257/686 |
| 2005/0095410 A1 | 5/2005 | Mazurkiewicz | |
| 2007/0163802 A1 | 7/2007 | Monthei | |
| 2008/0123016 A1* | 5/2008 | Kwak | G02F 1/133308 349/59 |
| 2010/0149755 A1* | 6/2010 | Tomioka | G06F 1/203 361/700 |
| 2011/0001706 A1* | 1/2011 | Sanford | G06F 3/044 345/173 |
| 2011/0174926 A1 | 7/2011 | Margis | |
| 2011/0255250 A1 | 10/2011 | Dinh et al. | |
| 2012/0048603 A1 | 3/2012 | Huang | |
| 2012/0066726 A1 | 3/2012 | Mondragon | |
| 2013/0063612 A1* | 3/2013 | Royster | H04N 21/2146 348/207.99 |

* cited by examiner

ELECTRONIC DEVICE

CROSS-REFERENCE TO RELATED APPLICATIONS

This application claims priority to European Application No. EP 12195119.8 and to U.S. Provisional Application No. 61/731,890, both of which were filed on Nov. 30, 2012, the entire disclosures of which are both incorporated by reference herein.

TECHNICAL FIELD

The present invention relates to an electronic device comprising a display module and an electronics module that are arranged in a common housing, wherein the common housing is completed by a front cover, wherein the display module is arranged directly adjacent to the front cover, wherein the electronics module comprises a printed circuit board having multiple layers and a plurality of electronic components attached to the printed circuit board, wherein the electronics module is arranged adjacent to the display module and wherein the printed circuit board comprises a first layer and a second layer delimiting the printed circuit board on opposing sides.

BACKGROUND

Compact electronic devices that comprise a display module and an electronics module in a common housing are well known to the public. Such devices are used, for example, as portable tablet computers or as wall-mounted flight attendant panels in aircraft. In principle, these electronic devices are compact versions of a regular computer, wherein all electronics (the electronics module) of the computer, a display or display module and an input means in form of a touch-sensitive display are assembled in a single common housing.

An exemplary embodiment of an electronic device of the prior art will now be described with reference to FIGS. 1 and 2 which show a prior art device of the above type.

An electronic device 1 shown in FIGS. 1 and 2 comprises an electronics module 3 and a display module 5 that are arranged in a common housing 7. The common housing 7 is completed by a front cover or wall 9 that is attached to the common housing 7 which is formed by a back cover or wall 11 and sidewalls and frequently serves as an electromagnetic interference shielding of and for the electronic means in the electronic device 1. Said front cover 9 comprises an optional protective layer 13 and a touch-sensitive layer 15 and is used as a user input means. If the electronic device 1 comprises the optional protective layer 13 the touch-sensitive layer 15 is arranged directly adjacent to or in contact with the protective layer 13. Various kinds of touch-sensitive layers 15 are known in the prior art that can be used in electronic device 1 e.g. resistive or capacitive touch-sensitive layers 15. The protective layer 13 is frequently made from mineral or non-mineral glass. However, the protective layer 13 could also be in the form of a thin plastic foil.

Directly adjacent to the front cover 9 the display module 5 is arranged. The display module 5 comprises a liquid crystal display (LCD) layer 17 and a backlight layer 19 that are housed in a display housing 21. At least a portion of the display housing 21 and, in particular, at least the portion facing the electronics module 3 is made from a conductive material such that it provides a shielding of electromagnetic interference between the display module 5 and the electronics module 3. A transparent side or wall 23 of the display housing 21 is arranged directly adjacent to the touch-sensitive layer 15 of the front cover 9. The LCD layer 17 is arranged in contact with the transparent wall 23 of the display housing 21 and illuminated by the backlight module 19, which is arranged directly adjacent to the LCD layer 17. The display housing 21 further comprises mounting holes 25 that are used to mount the display module 5 on the electronics module 3. Instead of the mounting holes 25 other mounting means may be provided on the display housing 21.

The electronics module 3 is arranged in the common housing 7 between the back cover or wall 11 of the housing 7 and the display module 5. The electronics module 5 comprises a multi-layer printed circuit board 27. The printed circuit board has multiple layers 29, 31, 33 out of which three are shown schematically in FIG. 2. The printed circuit board 27 is delimited by a first layer 29 and a second layer 33, i.e. the first layer 29 forms one of the two extended outer surfaces of the printed circuit board 27, and the second layer 33 forms the other, opposite extended surface. The first layer 29 faces towards the display module 5 and the second layer 33 faces towards the back cover 11 of the housing 7. On the first layer 29 various electronic components are arranged such as e.g. a processor and a graphics controller.

The electronic device 1 further comprises one or more cooling means 37 that are mounted inside the housing 7 onto the back cover 11.

The electronic device 1 of the prior art has several drawbacks. First, the display housing 21 that serves as a necessary electromagnetic shielding between the electronics module 3 and the LCD layer 17 and the backlight layer 19 is relatively heavy and adds considerably to the weight of the device. However, it cannot just be left aside as some shielding between the display module 5 and the electronics module 3 is necessary. Furthermore, the display housing 21 considerably increases the thickness of the electronic device 1 which is disadvantageous if the electronic device 1 shall be used in environments in which space is limited.

In the specific application of an electronic device in an aircraft as a flight attendant panel or as a display for an in-flight entertainment system (IFE) the production is further complicated as the mounting of the display layer 17 and the backlight layer 19 in the display housing 21 have to be modified to fulfil civil aviation specifications. Furthermore, the size of the display housings 21 and the mounting holes 25 provided therein considerably varies among different manufacturers, so that different displays modules 5 cannot be mounted to the same electronics module 3. In consequence, a redesign of the printed circuit board 27 is necessary whenever the display module 5 shall be exchanged with a display module of a different type.

SUMMARY

It is, therefore, an objective of the present invention to provide an electronic device that overcomes all or at least some of the drawbacks of the prior art.

The problem is solved by providing an electronic device wherein the first layer of the printed circuit board is an electromagnetic interference shielding layer and the first layer of the printed circuit board faces the display module.

An electronic device according to the invention comprises two modules that are arranged or stacked on top of one another in a common housing. The common housing is formed by a back cover and sidewalls that are in an exemplary embodiment formed integrally. A front cover is attached to the housing by mounting means and encloses the modules of the electronic device together with the common housing. The front cover could, however, also be considered being part of a housing that encloses the display and the electronics module. It could, therefore, also be said that the common housing enclosing the modules is formed by the back cover, the front cover and the sidewalls. A display module that is used for displaying information to a user of the electronic device is arranged next or adjacent to a front cover or front wall of the housing. On the opposite side of the display module an electronics module is arranged, which may also be considered to be disposed below the display module if looked upon from the front cover. The electronics module comprises a printed circuit board having at least a first and a second layer and a plurality of electronic components like e.g. a processor, a graphics controller and/or a memory unit. The first and the second layer, which could also be referred to as a top and a bottom layer if viewed from the front cover delimit the printed circuit board on either side, i.e. form the two opposite extended surfaces of the printed circuit board as described above with reference to the prior art.

In other words, the printed circuit board comprises at least two layers. It may, however, comprise any number of layers exceeding two as deemed necessary for the application of the electronic device. The first layer of the printed circuit board, that is arranged facing towards and preferably directly adjacent to the display module, is a layer that provides shielding against electromagnetic interference between the electronics module and the display module. In this manner, the electronics included in the display module are protected from radio frequency (RF) radiation of the electronics module and vice versa. For this purpose, the electromagnetic interference shielding layer comprises electrically conductive material or materials. To provide sufficient shielding the first layer has to be connected to a ground connection e.g. to the housing of the electronic device that serves as an electromagnetic interference shielding for the electronics module and the display module against any interference from outside the electronic device. In other words, an electromagnetic interference shielding layer is provided between the electronics module and the display module wherein the electromagnetic shielding layer is formed as a first layer on the printed circuit board wherein the first layer is arranged between the display module and all further layers of the printed circuit board.

The actual embodiment of the electromagnetic shielding layer depends on the electromagnetic fields and the RF frequencies to be suppressed. Depending on the needs the layout of the layer may vary e.g. in the implemented geometry, the materials the layer is made from or the thickness of the layer.

Providing a first layer that is formed as or constitutes an electromagnetic interference shielding between the display module and the electronics module is advantageous as the display module can be provided without any additional shielding and in particular without an additional display housing. Thereby, considerable weight can be saved and the overall dimensions of the electronic device can be reduced. Thus, in a preferred embodiment the display module 5 does not comprise a display housing.

The printed circuit board may preferably comprise a plurality of electromagnetic shielding layers. Additional electromagnetic shielding layers can, for example, advantageously be used to provide shielding at different RF frequencies.

In a preferred embodiment, the display module comprises a LCD layer and a backlight layer, the LCD layer being attached to the backlight layer, in particular an extended surface thereof. The first layer is arranged directly adjacent to the backlight layer and the LCD layer is arranged directly adjacent to the front cover. Throughout this document, the term directly adjacent when used with reference to a layer or a module refers to arranging two objects directly next to one another. The objects are, at best, in contact with one another but could in another embodiment also be separated by a thin layer of air or e.g. some kind of adhesive. If two objects are directly adjacent to one another no further layer or module that adds to the functionality of the electronic device is arranged between the layers. The preferred embodiment is advantageous as the display module is provided without a display housing so that the overall weight of the electronic device and its extension in all three dimensions are reduced.

It is further preferred that the front cover comprises a touch-sensitive layer and that the LCD layer is arranged directly adjacent to the touch-sensitive layer. In an exemplary embodiment, a protective layer is further added to the front cover, which protective layer could be formed e.g. from a scratch resistive mineral or non-mineral glass. Such protective layer preferably forms the exterior surface of the front cover, i.e. the surface accessible to the user. Various kinds of touch-sensitive layers are known in the prior art that can be used according to the performance required by the electronic device.

Arranging the front cover directly adjacent to the LCD layer or mounting the front cover directly onto the LCD layer is further advantageous as any parallax effects are avoided that may occur if a display housing is arranged between the LCD layer and the touch-sensitive layer. Touch-sensitive layers commonly comprise a matrix that records where the layer has been touched. The matrix of the touch-sensitive layer is correlated with the underlying LCD layer such that it can be determined which pixel a person intended to touch. If the touch-sensitive layer is arranged spaced apart from the LCD layer, a tilted view onto the display leads to perceived shift of the matrix elements with respect to the LCD layer. The matrix elements that seem to be registered with a certain pixel for a person looking under an angle smaller than 90° are actually registered with other pixels. Hence, the wrong matrix elements are touched. The latter can be avoided if the LCD housing is omitted and the touch-sensitive layer is placed directly adjacent to the touch-sensitive layer.

In a preferred embodiment the electronic components are arranged on the second layer of the printed circuit board allowing for a particularly slim design of an electronic device according to the invention. The second or bottom layer of the printed circuit board delimits the printed circuit board on the side opposite from the first or top layer. In a preferred embodiment all electronic components like a processor or a graphics controller are mounted onto the second layer of the printed circuit board.

It is further preferred that the second layer of the printed circuit board is arranged adjacent to a back cover of the common housing. This is advantageous as the first layer provides shielding against electromagnetic interference between the electronic components and the display module. In a preferred embodiment cooling means are mounted to the back cover of the housing. Mounting the cooling means to the back cover is advantageous as heat produced by the printed circuit board and the electronic components that are preferably mounted on the second layer can efficiently be removed from the housing.

Such cooling means can be active cooling means such as fans or thermoelectric cooling elements or passive cooling means. For passive cooling electronic components mounted to the printed circuit board can be arranged in direct contact with the common housing or heat pipes arranged inside the housing.

In a preferred embodiment the printed circuit board and the display module are attached to mounting means that are adapted for mounting the printed circuit board and the display module in the common housing. The mounting means can advantageously be designed to be able to hold LCD and backlight layers of slightly varying dimension, e.g. by using different mounting means or by being adjustable, thereby omitting a need for redesigning the printed circuit board whenever the display module is changed as it has to be done when using a display module having a housing with predefined mounting points. Advantageously, the mounting means can adhere to specific safety regulations like the safety regulations for civil aviation.

In a preferred embodiment the mounting means are further adapted for mounting the front cover, the display module and the printed circuit board in the common housing. Common mounting means for the front cover, the display module and the printed circuit board are advantageous as in contrast to an electronic device known in the prior art only the mounting means that are separate from the housing has to be adapted if one of the modules is exchanged and/or its dimensions are altered.

Each mounting means preferably comprises a first projection and a second projection. The printed circuit board is attached to a lower surface of the first projection, wherein in the mounted condition the lower surface faces towards the back cover of the common housing. The LCD layer is arranged in a recess formed between the first and the second projection, and the backlight layer is clamped between the LCD layer and the printed circuit board and abuts a lateral surface of the first projection, wherein the lateral surface extends perpendicular to the lower surface of the first projection.

In other words, the preferred mounting means provides a single element for stacking the printed circuit board, the backlight layer and the LCD layer one on top of another and holding them together. The printed circuit board is attached preferably releasably by screws or the like to a lower surface of the first projection of the mounting means i.e. the top layer of the printed circuit board is in contact with the lower surface. The distance between the lower surface and the back cover of the housing is preferably adapted such that electronic components can be in contact with the back cover for passive cooling of the components.

The LCD layer is held in a recess formed between the first and the second projection. A lateral surface of the mounting means extending between the first and the second projection preferably restricts any motion of the LCD layer in a direction parallel to the extension direction of the projections. Mounting the LCD layer in a recess is advantageous as the mounting is independent of mounting holes or the like already provided on the LCD layer.

Finally, the backlight layer is clamped between the LCD layer and the printed circuit board and its movement in a direction parallel to the extension direction of the projections is hindered by a lateral surface of the first projection. Clamping the backlight layer between the LCD layer and the printed circuit board provides for an extremely slim design. Furthermore, an exchange of the backlight layer is easily possible as only the thickness and the extension of the first projection have to be changed to adapt for differently sized backlight layers whereas the printed circuit board may remain unaltered.

In another preferred embodiment each mounting means comprises a top surface, wherein the top surface is adapted for attachment of a protective layer of a front cover and wherein the touch-sensitive layer is clamped between the protective layer and the LCD layer or the second projection. Clamping the touch-sensitive layer by means of the protective layer provides for an advantageous mounting of the touch-sensitive layer that can also easily be adapted.

An electronic device according to the invention can advantageously be used as a flight attendant panel in an aircraft as it provides a slim and lightweight design of an electronic device that can provide all the functions required by a flight attendant panel.

BRIEF DESCRIPTION OF THE DRAWINGS

An exemplary embodiment of an electronic device according to the present invention will now be described with reference to the drawings wherein.

DETAILED DESCRIPTION

Figure 1:
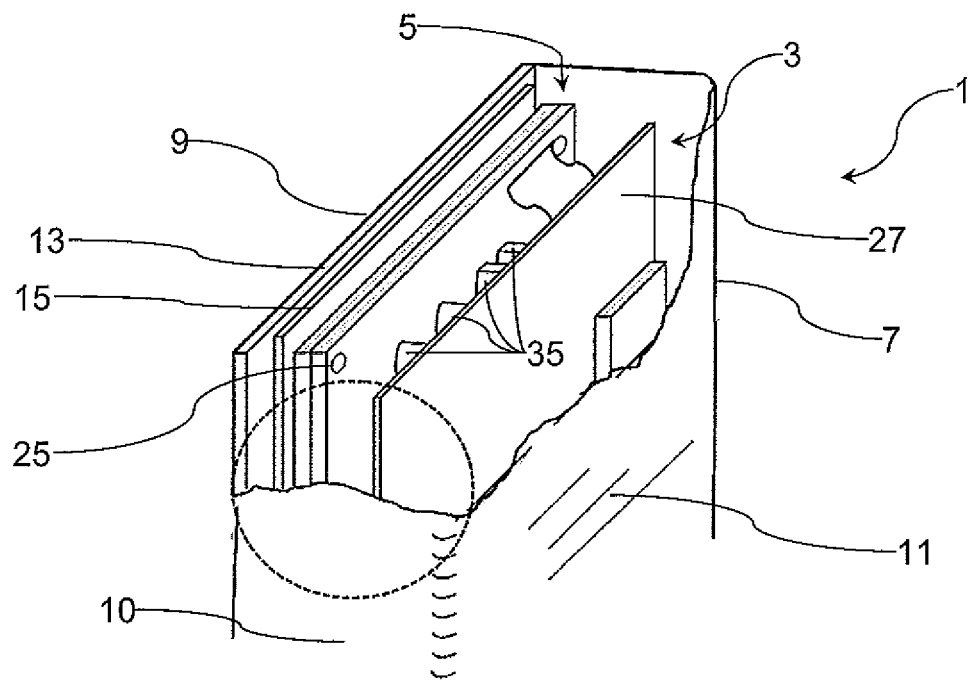
FIG. 1 is a schematic perspective view of an embodiment of an electronic device of the prior art.
Figure 2:
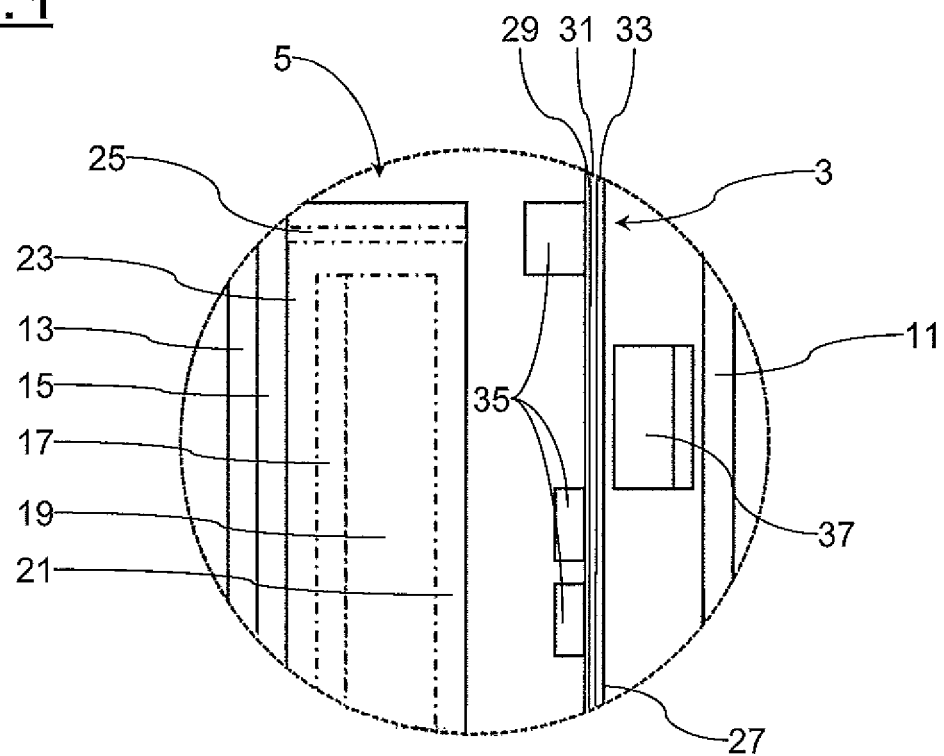
FIG. 2 is a sectional view of the electronic device of the prior art shown in FIG. 1.

In the following figures like reference numerals will be employed as have already been used with reference to FIGS. 1 and 2 whenever reference is made to an element of an electronic device that has the same name. However, this should not be mistaken as delimiting the exemplary embodiment to any specific details of the prior art embodiment.

Figure 3:
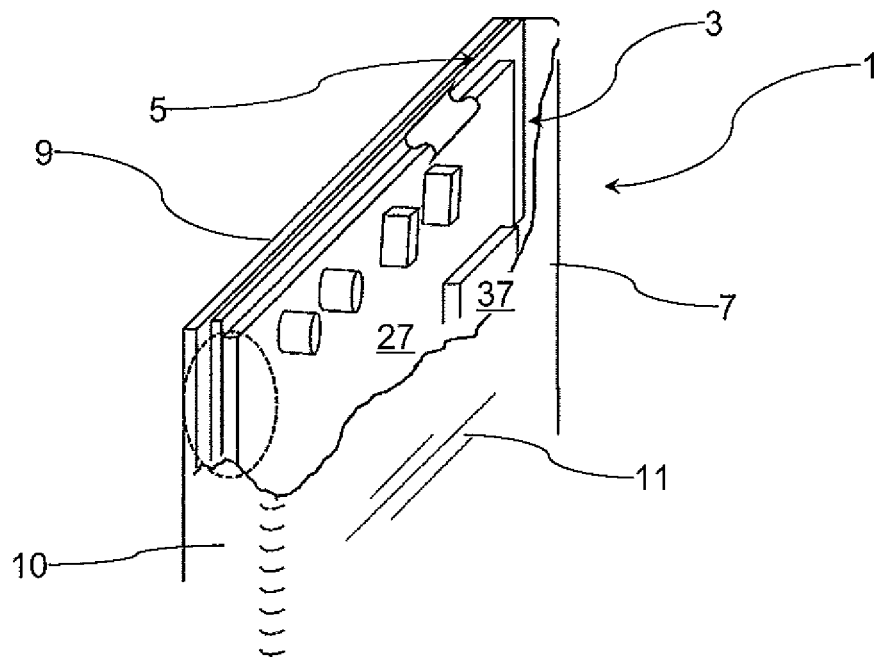
FIG. 3 is a schematic perspective view of an embodiment of an electronic device according to the present invention.
Figure 4:
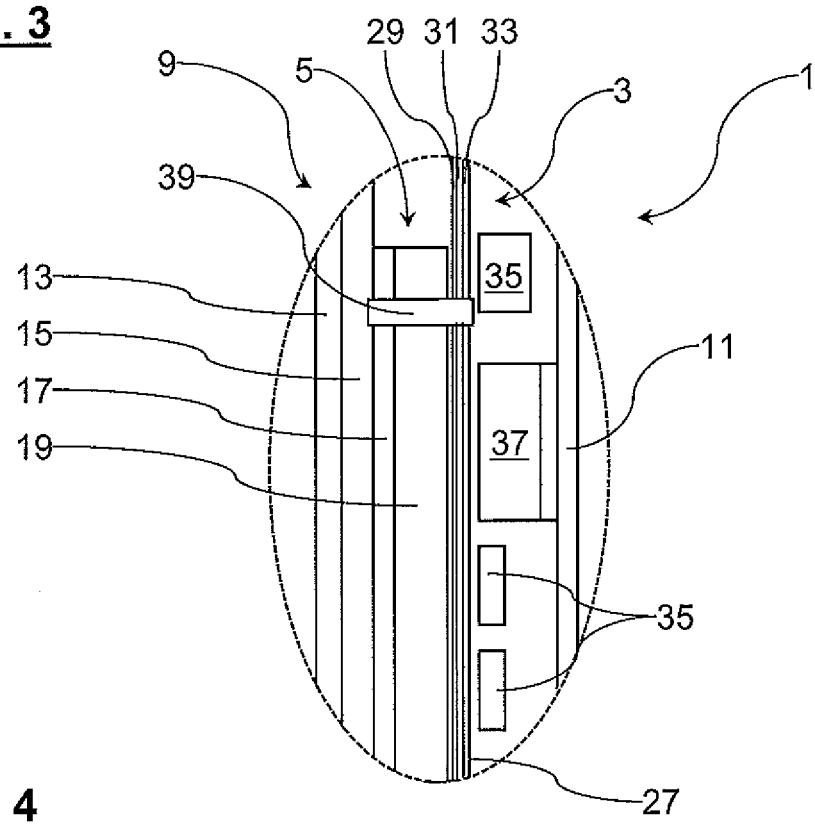
FIG. 4 is a sectional view of the electronic device according to the present invention of FIG. 3.

An electronic device 1 according to the present invention as shown in FIGS. 3 and 4 comprises an electronics module 3 and a display module 5 arranged in a common housing 7. The common housing is completed by a front cover or wall 9. The common housing is formed by sidewalls 10 and a back cover or wall 11 that can be formed integrally. The housing 7 and the front cover 9 serve as an electromagnetic shielding of the electronics module 3 and the display module 5 from external electromagnetic interference.

The front cover 9 comprises a protective layer 13 and a touch-sensitive layer 15 as can be seen in FIG. 4. The protective layer 13 protects the touch-sensitive layer 15, that is arranged directly adjacent to, or, to be more precise, in contact with the protective layer 13, from external damage.

Directly adjacent to—and in the embodiment shown in contact with—the front cover 9 the display module 5 is arranged. As can be seen best in FIG. 4, the display module comprises a LCD layer 17 arranged on top of a backlight layer 19. The LCD layer 17 is arranged directly adjacent to the touch-sensitive layer 15. In other words, the LCD layer 17 is enclosed by the touch-sensitive layer 15 towards the front cover 9 of the housing 7 and by the backlight layer 19 towards the rear or back cover 11 of the housing 7. In contrast to the display module 5 of the prior art as shown in FIGS. 1 and 2, the display module 5 according to the present invention does not comprise a display housing. This reduces the thickness of the electronics device 1 considerably, which is advantageous.

The electronics module 3 comprising a printed circuit board 27 and a plurality of electronic components 35 is arranged directly adjacent to the display module 5. The printed circuit board 27 is formed by a plurality of layers 29, 31, 33 out of which three exemplary layers 29, 31, 33 are shown in FIG. 4. As can be seen in FIG. 4, a first layer 29 is arranged directly adjacent to the backlight layer 19 of the display module 5. In FIG. 4 a small air gap is shown between the first layer 29 and the backlight layer 19. However, it is well conceivable that the backlight layer 19 and the first layer 29 are in contact with one another. The first layer 29 is designed as an electromagnetic interference protection or shielding layer 29 that protects the display module 5 from electromagnetic interference from the printed layer circuit board 27 and any electronic components 35 arranged on the printed circuit board 27 and vice versa. An electromagnetic interference protection layer embedded into the printed circuit board 27 is an advantageous means for providing electromagnetic interference protection between the display module 5 and the electronics module 3 as a printed circuit board layer is considerably thinner than a housing of the display module 5. Hence, the electronic device 1 is thinner and lighter than a comparable electronic device 1 of the prior art as shown in FIGS. 1 and 2.

The electronic components 35 are mounted to the second or bottom layer 33 of the printed circuit board. The electronic components are thus shielded from any electromagnetic interference from the display module 5 and are also preferably directly adjacent to the back cover 11 of the housing 7. On the back cover 11 cooling means 37 can be located which provide for an efficient cooling of the electronic components 35 and the printed circuit board 27. The cooling means 37 can be active cooling means such as thermoelectric cooling elements or fans. It is, however, preferred to employ passive cooling means such as heat pipes or simply placing the electronic components 35 in direct contact with the common housing 11.

The printed circuit board 27 is further preferably attached to mounting means 39 which can be used to mount the electronics module 3 and the display module 5 to the front cover 9 of the housing.

Figure 5:
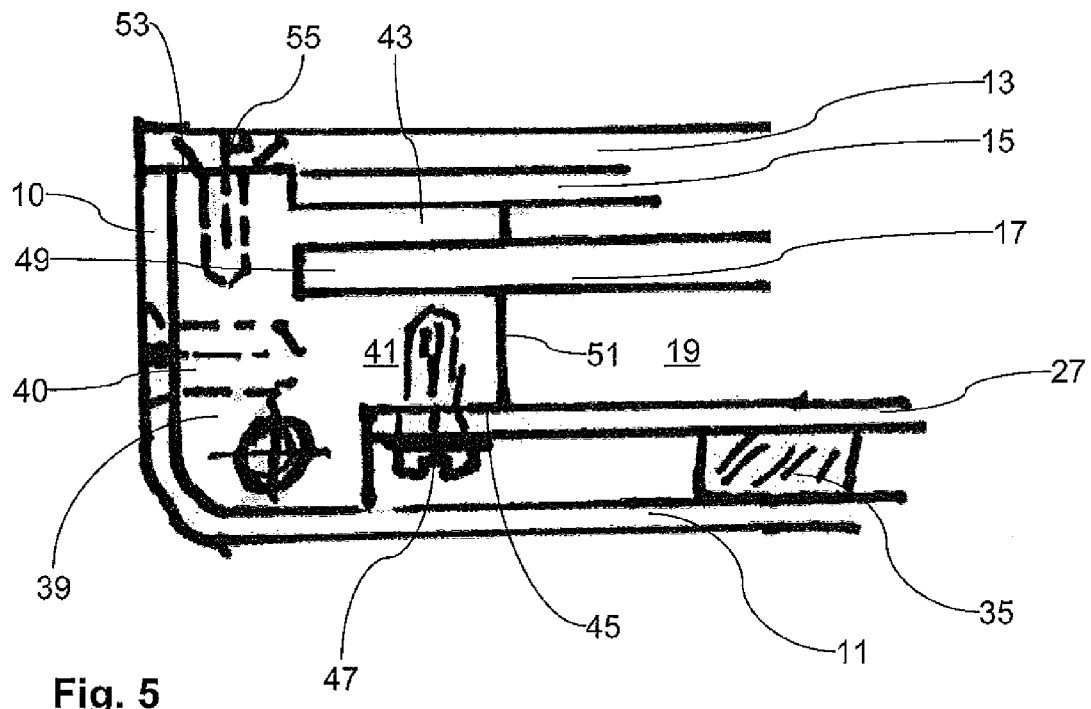
FIG. 5 is a sectional view of an exemplary embodiment of a mounting means according to the present invention and FIG. 6 is a perspective view of the exemplary embodiment of a mounting means.
Figure 6:
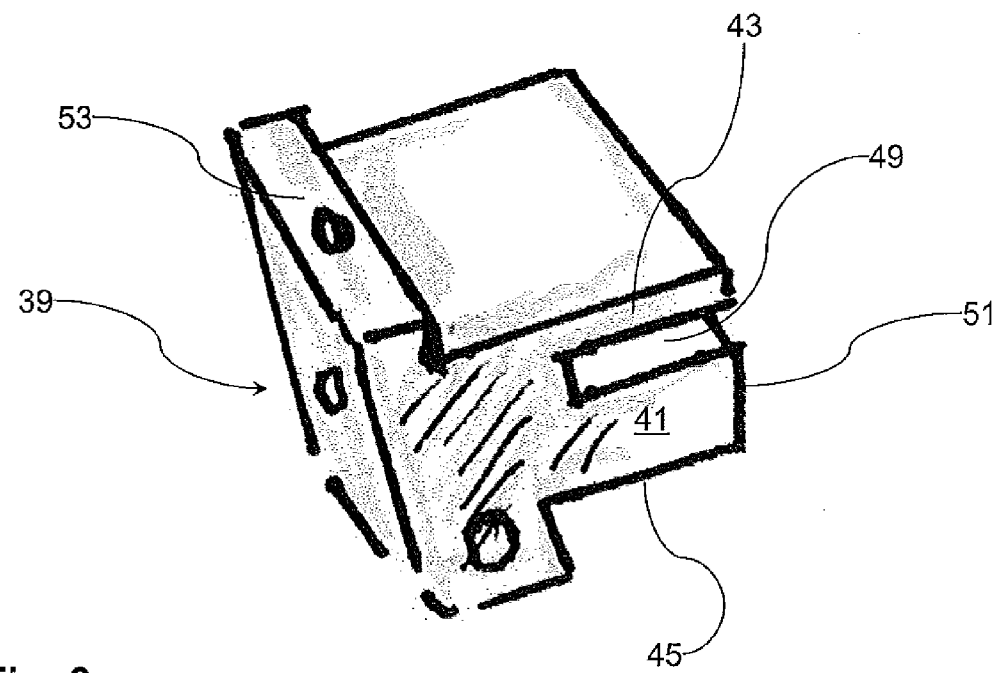

An exemplary embodiment of a mounting means 39 is shown in FIGS. 5 and 6. The mounting means 39 provides a single means for stacking the printed circuit board 27, the backlight layer 19, the LCD layer 17, the touch-sensitive layer 15 and the protective layer 13 one onto another and arranging the stacked layers 13, 15, 17, 19, 27 safely inside the common housing 11. The mounting means 39 can be formed e.g. as a single piece of a plastic material and are attached to the inside the common housing 7 e.g. to the sidewalls as in FIG. 5 or to the back cover 11 by fixation means 40 in the form of screws.

The mounting means 39 comprises a first projection 41 and a second projection 43 extending perpendicular to the sidewalls 10 and parallel to the back cover 11 of the common housing 7 when the mounting means 39 are arranged in the housing 7. The printed circuit board 27 is mounted to a lower surface 45 of the first projection 41. The lower surface 45 faces towards the back cover 11 of the common housing 7 and is in contact with the first layer 29 of the printed circuit board 27. Attaching the printed circuit board 27 to the lower surface 45 can be achieved by various fixation means such as screws 47 or an adhesive.

Passive cooling of the electronic components 35 that are attached to the printed circuit board 27 is improved if some or all of the components 35 are thermally coupled with the back cover 11. Hence, the mounting means 39 is designed such that some or all of the components 35 can be arranged in contact with the back cover 11 or can be thermally coupled e.g. by the use of heat pipes and/or thermal grease to the back cover 11.

Between the first and the second projection 41, 43 a recess 49 is formed in which the LCD layer 17 can be arranged. The height and the depth of the recess 49 can be easily adapted to match different sizes of LCD layers 17. Preferably, the depth of the recess 49 is designed such that only non-active areas of the LCD layer 17 are obstructed by the second projection 43.

The spacing that is provided between the LCD layer 17 and the printed circuit board 27 by the first projection 41 has been adapted to the thickness of the backlight layer 19. Hence, the backlight layer 19 is clamped between the printed circuit board 27 and the backlight layer 19 and advantageously no further fastening means are necessary to secure the backlight layer 19 in the electronic device 1. Lateral displacement of the backlight layer is hindered by a lateral surface 51 of the first projection 41. The lateral surface extends perpendicularly to the lower surface 45 and the extension direction of the layers 13, 15, 17, 19, 27 and abuts a side of the backlight layer 19.

Furthermore, the protective layer 13 is attached to a top surface 53 of the mounting means 39 by fastening means 55. The fastening means 55 can be in the form of a screw 55. The protective layer 13 clamps the touch-sensitive layer 15 to the second projection 43 such that no further fastening means are necessary to secure the touch-sensitive layer 15 in the housing 7 of the electronic device 1.

In summary, the exemplary mounting means 39 provide an advantageous way of arranging the different elements of the electronic device 1 inside the housing 7. The electronic device 1 can be easily adapted to different modules or layers simply by adaptation of the mounting means 39. Furthermore, the mounting means 39 can be designed to conform to safety restrictions such as the safety requirements that are in place for civil aviation.

The invention claimed is:

1. An electronic device comprising:
    a display module and an electronics module that are arranged in a common housing,
    wherein the common housing is completed by a front cover,
    wherein the display module is arranged directly adjacent to the front cover,
    wherein the electronics module comprises a printed circuit board having multiple layers and a plurality of electronic components attached to the printed circuit board,
    wherein the electronics module is arranged adjacent to the display module and wherein the printed circuit board comprises a first layer and a second layer delimiting the printed circuit board on opposing sides,
    wherein the first layer is an electromagnetic interference shielding layer, and
    wherein the first layer is arranged facing the display module.

2. An electronic device according to claim 1, wherein the printed circuit board comprises a plurality of electromagnetic interference shielding layers.

3. An electronic device according to claim 1, wherein the display module comprises a liquid crystal display layer and a backlight layer, the liquid crystal display layer being attached to the backlight layer, wherein:
the first layer is arranged directly adjacent to the backlight layer, and
the liquid crystal display layer is arranged directly adjacent to the front cover.

4. An electronic device according to claim 3, wherein the front cover comprises a touch-sensitive layer and wherein the liquid crystal display layer is arranged adjacent and preferably directly adjacent to the touch-sensitive layer.

5. An electronic device according to claim 1, wherein the electronic components are arranged on the second layer of the printed circuit board.

6. An electronic device according to claim 1, wherein the printed circuit board and the display module are attached to a mount that is adapted for mounting the printed circuit board and the display module in the common housing.

7. An electronic device according to claim 6, wherein the mount is adapted for mounting the front cover, the display module and the printed circuit board in the common housing.

8. An electronic device according to claim 6, wherein the mount comprises a first projection and a second projection,
wherein the printed circuit board is attached to a lower surface of the first projection, the lower surface facing towards the back cover of the common housing,
wherein the liquid crystal display layer is arranged in a recess formed between the first and the second projection,
wherein the backlight layer is clamped between the liquid crystal display layer and the printed circuit board and abuts a lateral surface of the first projection, the lateral surface extending perpendicularly to the lower surface of the first projection.

9. An electronic device according to claim 8, wherein the mount comprises a top surface, wherein the top surface is adapted for attachment of a protective layer, which constitutes a part of the front cover and wherein the touch-sensitive layer is clamped between the protective layer and the liquid crystal display layer or the second projection.

10. An electronic device according to claim 1, wherein the common housing comprises a back cover, wherein the back cover is arranged adjacent to the second layer of the printed circuit board, and comprising a cooling element for cooling the printed circuit board and/or the electronic components attached to the back cover.

11. A flight attendant panel comprising an electronic device according to claim 1.

* * * * *